United States Patent

[11] 3,621,345

[72] Inventor Wolfdietrich Kasperkovitz
Emmasingel, Eindhoven, Netherlands
[21] Appl. No. 811,758
[22] Filed Apr. 1, 1969
[45] Patented Nov. 16, 1971
[73] Assignee U.S. Philips Corporation
New York, N.Y.
[32] Priority Apr. 4, 1968
[33] Netherlands
[31] 6804787

[54] SEMICONDUCTOR DEVICE HAVING A BISTABLE CIRCUIT ELEMENT
27 Claims, 20 Drawing Figs.

[52] U.S. Cl. .......... 317/235, 307/299, 307/324
[51] Int. Cl. .......... H01l 1/18, H01l 11/00
[50] Field of Search .......... 317/235 (21.3), 235 (25); 340/17 NR; 307/299, 301, 324, 325

[56] References Cited

UNITED STATES PATENTS

| | | | |
|---|---|---|---|
| 2,907,000 | 9/1959 | Lawrence | 340/173 |
| 2,927,221 | 3/1960 | Armstrong | 317/235 |
| 2,986,653 | 5/1961 | Rutz | 307/299 |
| 3,114,050 | 12/1963 | Dorendorf | 307/299 |

*Primary Examiner*—Jerry D. Craig
*Attorney*—Frank R. Trifari

ABSTRACT: A semiconductor device having a bistable semiconductor circuit element with an I–V characteristic exhibiting three branches having a positive differential resistance is described. The bistable circuit element comprises first and second contacts between which majority carrier flow in the semiconductor is established. It also comprises an emitter for establishing minority carrier flow to the first contact to conductivity modulate the region in between. The emitter is located between the first and second contacts and is connected to an auxiliary contact located outside the region of conductivity modulation.

INVENTOR.
WOLFDIETRICH KASPERKOVITZ
BY
Frank R. Trifari
AGENT

*INVENTOR.*
WOLFDIETRICH KASPERKOVITZ
*BY*
[signature]
AGENT

INVENTOR.
WOLFDIETRICH KASPERKOVITZ
BY
AGENT

INVENTOR.
WOLFDIETRICH KASPERKOVITZ
BY Frank R. Trifari
AGENT

INVENTOR.
WOLFDIETRICH KASPERKOVITZ
BY
AGENT

INVENTOR.
WOLFDIETRICH KASPERKOVITZ
BY
Frank R. Trifari
AGENT

SEMICONDUCTOR DEVICE HAVING A BISTABLE CIRCUIT ELEMENT

The invention relates to a semiconductor device comprising a semiconductor body having a bistable circuit element.

Such devices are used inter alia in computer technology. The bistable elements preferably used in this technology are so-called flip-flop circuits which themselves may be constructed from, for example, transistors, PNPN-diodes, tunnel diodes, resistors, and so on.

Such flip-flop circuits have a comparatively large surface area and also a rather high dissipation, while in addition their structure is rather complicated. Moreover, in combining a large number of such flip-flop circuits to form, for example, memories, it is often difficult to obtain a contact which is little disturbed as a result of the large number of connections.

It is the object of the invention to provide a device having a new bistable circuit element of a very simple construction which covers a very small surface area and has a small dissipation while upon combining to form larger units it can easily be contacted and be used as a component in a variety of circuits, particularly planar integrated circuits.

The invention is based on the recognition of the fact that by using conductivity modulation by injection of minority charge carriers and by using the properties of a PN junction in a suitably chosen semiconductor structure the desired switching function can be realized directly in the circuit element itself without having to use impedances outside the circuit element.

According to the invention, a semiconductor device employing a semiconductor body having a bistable circuit element is therefore characterized in that the circuit element comprises a region of one conductivity type, on which region a first connection contact is provided and an emitter electrode for producing an injection stream of minority charge carriers through the region from the emitter electrode to the first connection contact as a result of which conductivity modulation can occur in a modulation region extending from the emitter electrode to the first connection contact, a second connection contact being provided on said region and being connected to a connection conductor to produce between the first and the second connection contact a stream of majority charge carriers in the opposite direction as the said injection stream through the region, the emitter electrode being situated between the first and the second connection contact and being conductively connected to a further connection contact, hereinafter termed auxiliary contact, provided on the region of one conductivity type outside the modulation region, all this in such manner that two stable input voltages can occur which differ from zero with the same input current between an input conductor connected to the emitter electrode and an input conductor connected to the first connection contact in that the input current shows a minimum and a maximum dependent upon the input voltage, the input voltage associated with the minimum being lower than that associated with the maximum.

Conductivity modulation in the sense of the invention is to be deemed present here and hereinafter when the concentration of the injected minority charge carriers is at least of the same order of magnitude as the equilibrium concentration of the majority charge carriers present as a result of the doping.

An emitter electrode is to be understood to mean herein an electrode which is capable of injecting minority charge carriers into the semiconductor body including an electrode region, if any, from semiconductor material and a supply conductor connected thereto.

The device according to the invention comprises a circuit element of a very simple structure which in principle comprises only a semiconductor region of one conductivity type with an emitter electrode and two or three connection contacts. The auxiliary contact may be constructed as a separate third contact but may in circumstances also coincide with the second connection contact.

A connection contact is to be understood to mean herein a contact with which a connector joins the semiconductor body and forms a connection therewith, for example, an ohmic connection. A semiconductor region which may be provided between the conductor and the semiconductor body on the contact place and which serves for promoting the desired contact properties, for example, a diffused region of the same conductivity type as the semiconductor region to be connected, is to be understood to be included in the term connection contact.

Dependent upon the use and the construction of the semiconductor device according to the invention a suitable value will be given to the resistance of the current path of the second connection conductor connected to the second connection contact via the second connection contact through the said region of one conductivity type up to the path of said region located below the emitter electrode. This resistance may be formed entirely by the part of the said current path extending in the said region. In circumstances, however it may be of advantage, for example, in connection with the place chosen for the second connection contact, to provide the said resistance at least partly by connecting the second connection contact to the associated connection conductor through a series resistor.

This resistor, for example, entirely or partly in the form of a thin film may be located on an insulating layer provided on the semiconductor surface or be integrated in the semiconductor body in known manner.

For generating the said current between the first and second connection contact through the region of one conductivity type, the device according to the invention should be incorporated in a circuit in which a supply voltage is applied between the first connection contact and the connection conductor of the second connection contact, so that in the region of one conductivity type a stream of majority charge carriers is generated at least across the modulation region opposite to the direction of the injection stream. Since the value of the input current in which the stable voltage conditions of the bistable circuit element occur depends upon the value of the said supply voltage and the dissipation of the element is determined inter alia by the said value of the input current, the supply voltages is preferably chosen to be so that the stable input voltages occur at an input current which is substantially equal to zero.

The emitter electrode may consist, for example, of a metal semiconductor contact which is capable of injecting minority charge carriers into the said region, for example, a point contact. The emitter electrode, however, is preferably formed by a surface region, for example, a diffused surface region of the other conductivity type, which forms a PN junction with the region of one conductivity type.

The contacts and the emitter electrode may be provided at different places on or in the semiconductor body and/or on different surfaces of the body. However, the device according to the invention is particularly suitable for being used in the form of a planar integrated circuit. Therefore, according to the invention, the said connection contact and the emitter electrode are advantageously provided on the same surface, preferably a flat surface, of the semiconductor body. In a further preferred embodiment according to the invention this surface is fully or partly coated with an electrically insulating layer, the connection and input conductors being situated at least partly on the insulating layer and adjoining the semiconductor body through apertures in the insulating layer.

The device according to the invention may be used as a component in many circuits in which a number of equal circuit elements are advantageously arranged in rows or in a multidimensional network. A preferred embodiment of the device which is particularly important as such is characterized according to the invention in that the first and the second connection contacts are constituted by two substantially parallel conductors. These conductors may consist, for example, of metal strips. In circumstances, however, the parallel conductors may advantageously comprise strip-shaped diffused surface regions which in addition may be coated, at least locally, with a metal layer so as to increase the conductivity, all this inter alia to facilitate the construction of intersecting connections.

A very important preferred embodiment of the device according to the invention is characterized in that the auxiliary contact is situated with respect to the emitter electrode and the first connection contact in such manner that in the operating condition, in the absence of conductivity modulation, the potential difference in the absolute sense between the auxiliary contact and the first connection contact is smaller than the difference between the potential of the first connection contact and the potential of the region of one conductivity type at the area of the point of the emitter electrode which is situated nearest to the first connection contact. In this embodiment the emitter electrode is polarized in the forward direction in one stable condition, the ignited condition, in which conductivity modulation occurs, whereas in the other stable condition, the extinguished condition, in which no conductivity modulation occurs, the emitter electrode is polarized in the reverse direction.

Such a bistable element is furthermore particularly suitable to be coupled in a row or network together with other equal circuit elements. For example, according to an important preferred embodiment, a semiconductor device according to the invention constitutes a shift register having at least two bistable elements which are arranged on the same region of one conductivity type, the first connection contacts and also the second connection contacts of the two elements being connected together electrically and the elements being coupled by a collector coupling contact and an emitter coupling contact which are electrically connected together, the collector coupling contact being provided on the modulation region of the first bistable element and being adapted to collect minority charge carriers therefrom, the emitter coupling contact being situated so near to the auxiliary contact of the second bistable element that the emitter coupling contact can produce conductivity modulation by injection of minority charge carriers between said auxiliary contact and the second connection contact over substantially the whole distance between said contacts.

The said coupling contacts, like the emitter electrodes, may be constructed as metal semiconductor contacts and as point contacts, respectively, with the desired electrical properties as regards injection and collection of minority charge carriers. Preferably, however, one or more of the coupling contacts are formed by a diffused surface region of the other conductivity type.

Such a shift register can be operated particularly efficaciously by temporarily varying the sign of the supply voltage, for example, by a pulse opposite to the supply voltage, to adjust the stable voltage condition of the bistable elements.

Besides as a component in a shift register, a device employing a bistable element as described above may particularly advantageously be used according to the invention in binary memories. A very important preferred embodiment of such a device is therefore characterized according to the invention in that the device constitutes a memory element in which for introducing binary information a readin contact is provided between the emitter electrode and the second connection contact, said readin contact being adapted to inject minority charge carriers so that conductivity modulation can occur between the emitter electrode and the first connection contact.

The binary information is introduced by a temporary reduction of the supply voltage at a given bias voltage between the readin contact and the first connection contact, the supply voltage, the reduction of the supply voltage, and the said bias voltage being mutually chosen to be so that in the absence of said bias voltage, the bistable element, after restoring of the original supply voltage, is in the condition with the highest input voltage, whereas in the presence of the said bias voltage during the reduction of the supply voltage minority charge carriers are injected through the readin contact so that the bistable element, after restoring of the original supply voltage, is in the condition with the lowest input voltage.

Such a memory element can furthermore be read in a particularly simple manner. For that purpose, according to a further important preferred embodiment according to the invention, a readout contact is provided on the modulation region, in which a readout voltage can be derived between said readout contact and the first connection contact. The readout contact is advantageously connected to the base and the first connection contact to the emitter of a transistor which is preferably constituted by a surface region of the other conductivity type, the base region, provided in the region of one conductivity type, and an emitter region and collector region provided therein. The stored binary information can be read in a nondestructive manner by producing a temporary increase of the supply voltage, while the collector of the transistor is polarized in the reverse direction by a bias voltage between the collector and the emitter, the supply voltage and the increase thereof being chosen to be so that, if the bistable element is in the condition with the lowest input voltage, the emitter current of the transistor remains substantially equal to zero during the increase of the supply voltage and that, if the bistable element is in the condition with the highest input voltage, an emitter current occurs only during the increase of the supply voltage in the transistor which current can be detected at the collector.

According to another likewise very important preferred embodiment, the auxiliary contact in the device according to the invention is situated so with respect to the emitter electrode and the first connection contact that in the operating condition and in the absence of conductivity modulation the potential difference in the absolute sense between the auxiliary contact and the first connection contact exceeds the difference between the potential of the first connection contact and the potential of the region of one conductivity type at the area of the point of the emitter electrode which is situated nearest to the first connection contact. In order to obtain the desired input characteristic, the auxiliary contact can be provided at various places suitable for that purpose on the region of one conductivity type. It can be computed, for example, that for a unidimensional case the desired input current characteristic can be obtained if the condition $R_3 < CR_1$ is satisfied, where $R_1$ is the resistance of the region of one conductivity type between the first connection contact and the nearest point of the emitter electrode in the absence of conductivity modulation, and $R_3$ is the resistance between the connection conductor associated with the second connection contact and the part of the said region located below the emitter electrode, while C is the ratio of the mobility of the minority charge carriers to that of the majority charge carriers in the region of one conductivity type. Since, however, the three-dimensional computation holding good for practical cases is extremely complicated, the place of the contacts will usually be determined experimentally. The auxiliary contact, dependent upon the geometry of the device, can adjoin the region of one conductivity type at a small distance from the emitter electrode or in circumstances also even advantageously overlap the emitter electrode at least partly which minimizes the required surface area.

In such a device, as contrasted with the above-described embodiments, the emitter electrode in the operating condition is polarized in the forward direction in both stable voltage conditions.

The preferred embodiment under consideration may advantageously be controlled by producing a temporary variation, for example, in the form of a pulse, in the supply voltage or in the input current, to adjust the stable voltage condition of the device. The variation used in the supply voltage should be chosen to be so that the extreme value of the supply voltage occurring during the variation is at least so large that the minimum and the maximum of the input current are both larger or are both smaller than the value of the input current at which the two said stable input voltages occur.

In the case of control by means of the input current, the input current variation should at least be of such a value that the extreme value of the input current occurring during the variation is situated outside the interval which is limited by the said minimum and maximum of the input current characteristic.

In order that the invention may be readily carried into effect, certain embodiments thereof will now be described in greater detail, by way of example, with reference to the accompanying drawings, in which, FIG. 1 is a diagrammatic plan view of a semiconductor device according to the invention.

Figure 1:
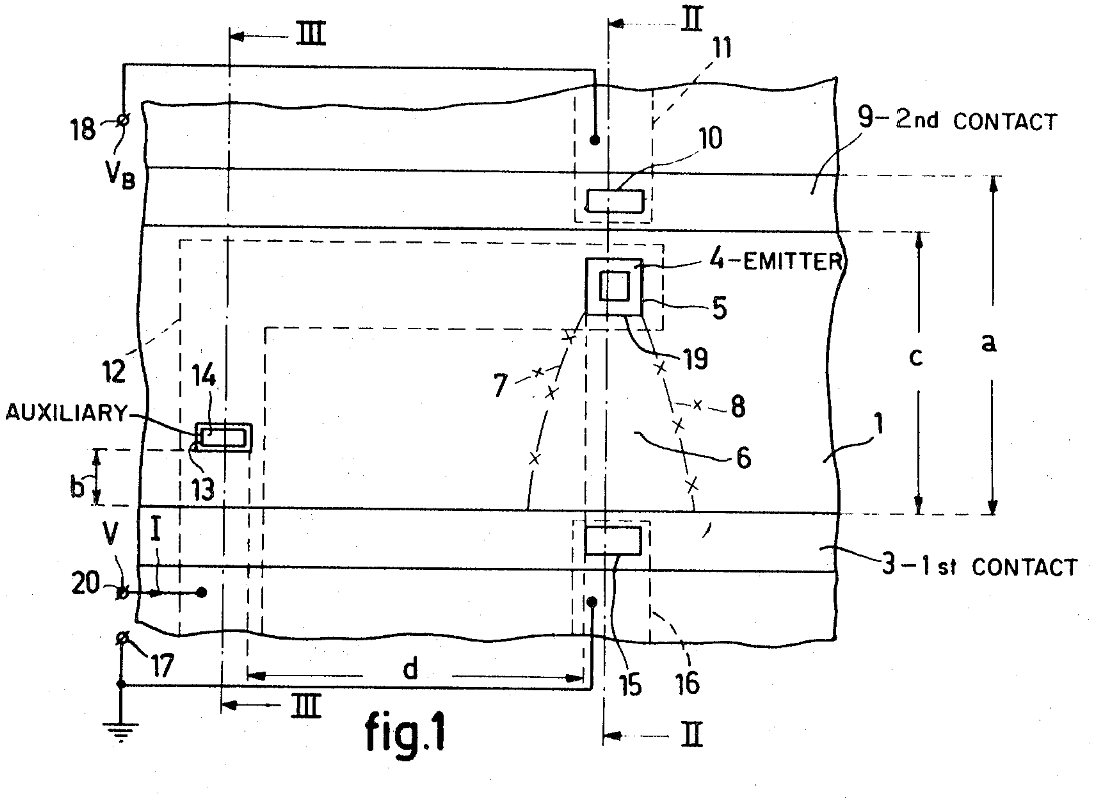
Figure 5A:
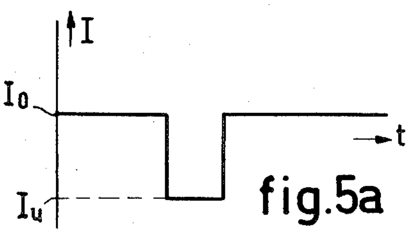
Figure 5C:
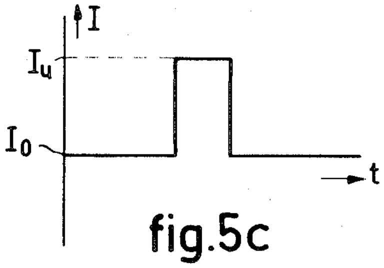
Figure 5B:
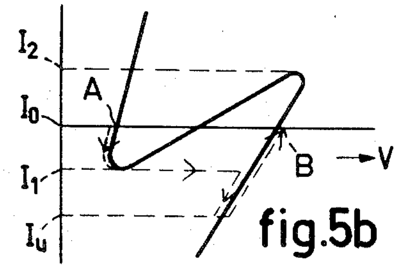

FIGS. 5*a* and 5*b* show the variation of a negative and a positive input current pulse for controlling the device shown in FIG. 1.

Figure 5D:
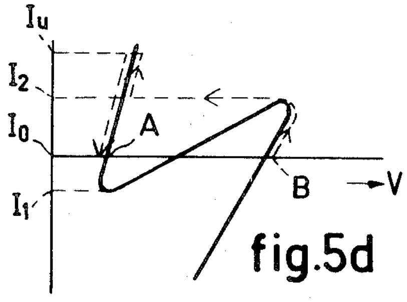
Figure 6:
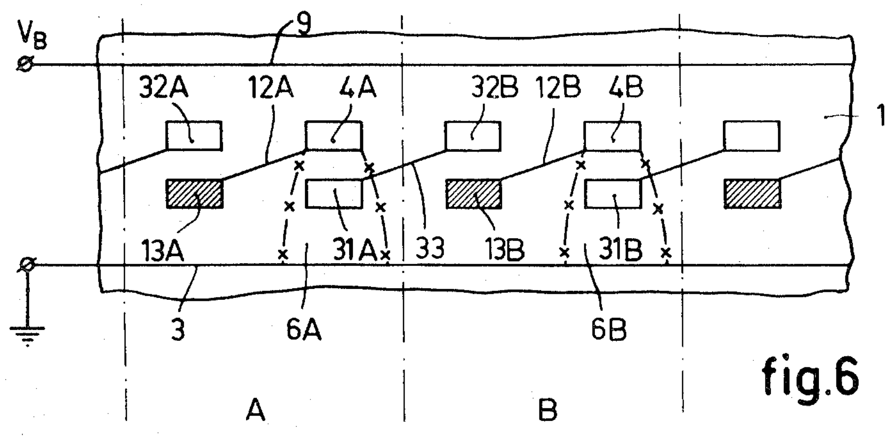

FIGS. 5*c* and 5*d* show the variation of the voltage condition at the input of the device shown in FIG. 1 which occurs as a result of the control pulses shown in FIGS. 5*a* and 5*b*, respectively, FIG. 6 is a diagrammatic plan view of another semiconductor device according to the invention.

Figure 7:
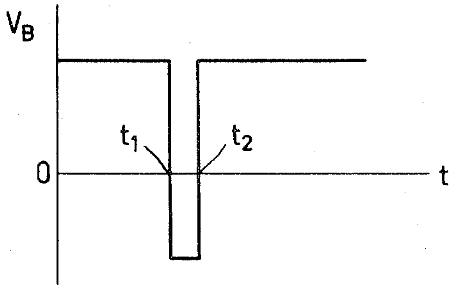

FIG. 7 is a control pulse on the supply voltage for operating the device shown in FIG. 6.

Figure 8:
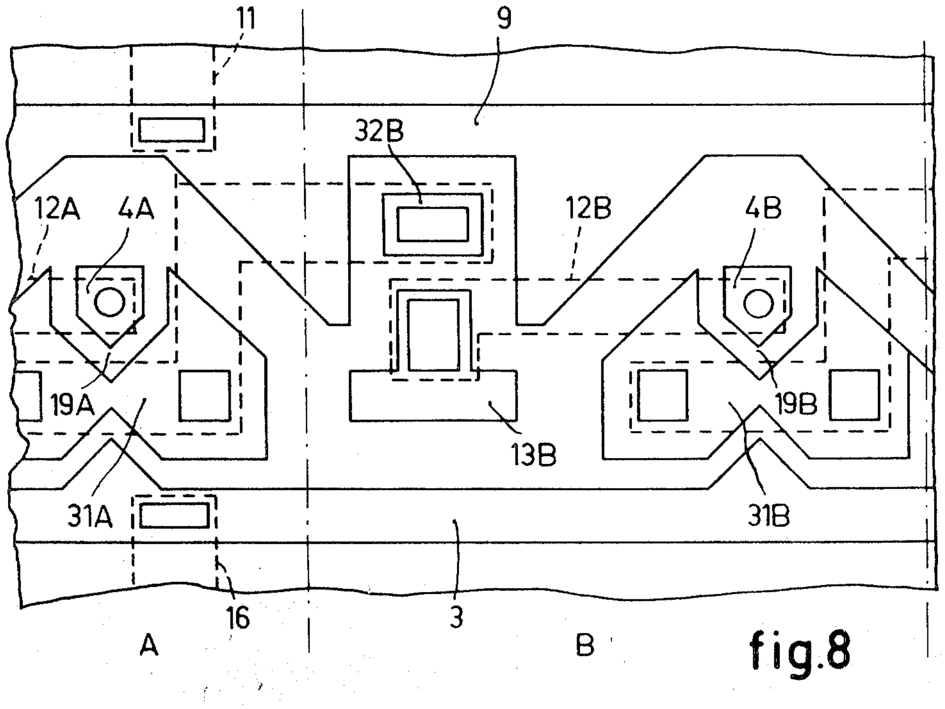

FIG. 8 is a plan view of a few details of the device shown in FIG. 6.

Figure 9:
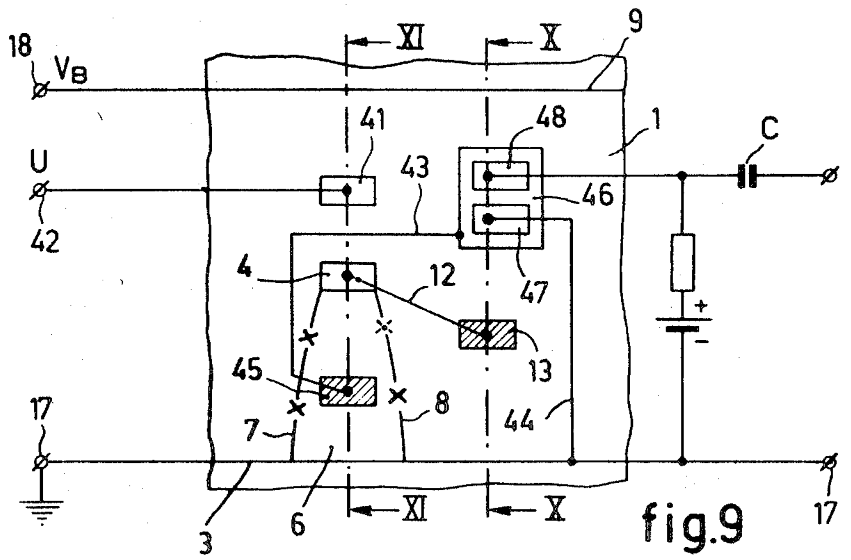

FIG. 9 is a diagrammatic plan view of a further semiconductor device according to the invention.

Figure 10:
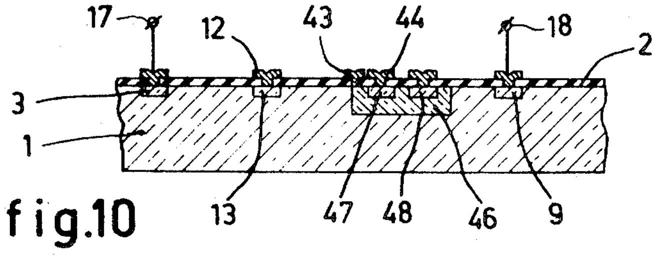
Figure 11:
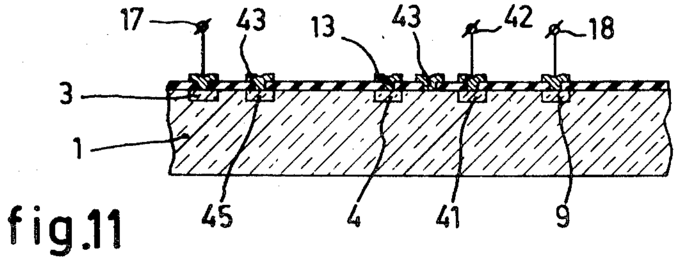
Figure 12:
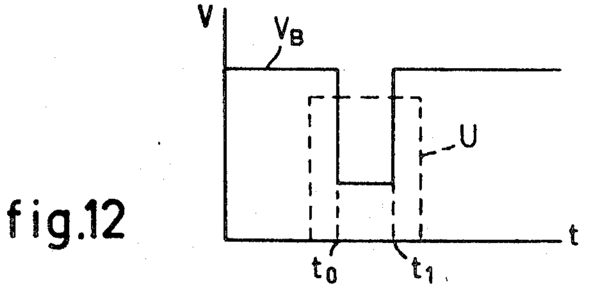

FIGS. 10 and 11 are diagrammatic cross-sectional views of the device shown in FIG. 9 taken on the lines X—X and XI—X, FIG. 12 shows the variation of the supply voltage $V_B$ and the bias voltage U in controlling the device shown in FIG. 9.

Figure 13:
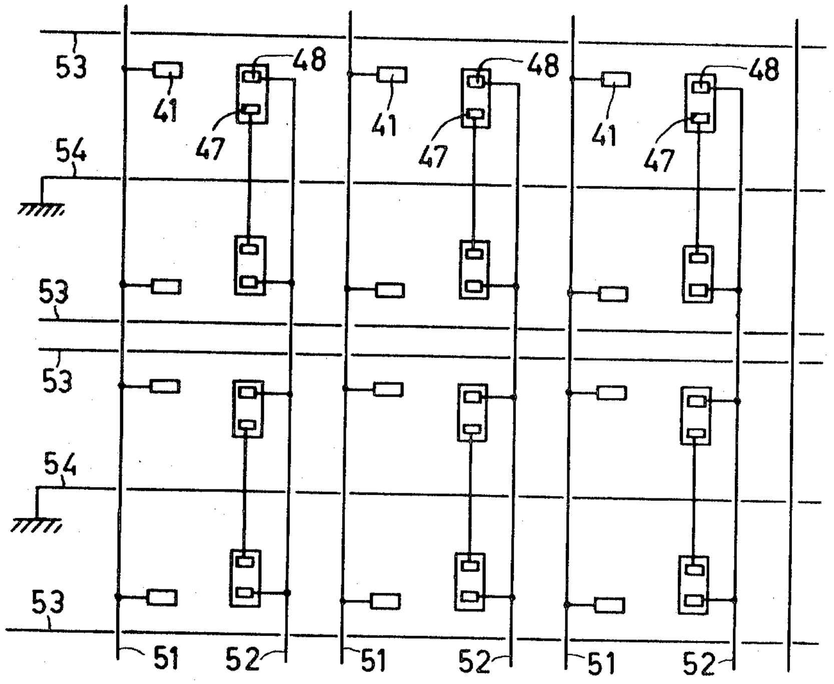

FIG. 13 shows a memory circuit constructed from device shown in FIG. 9.

Figure 14:
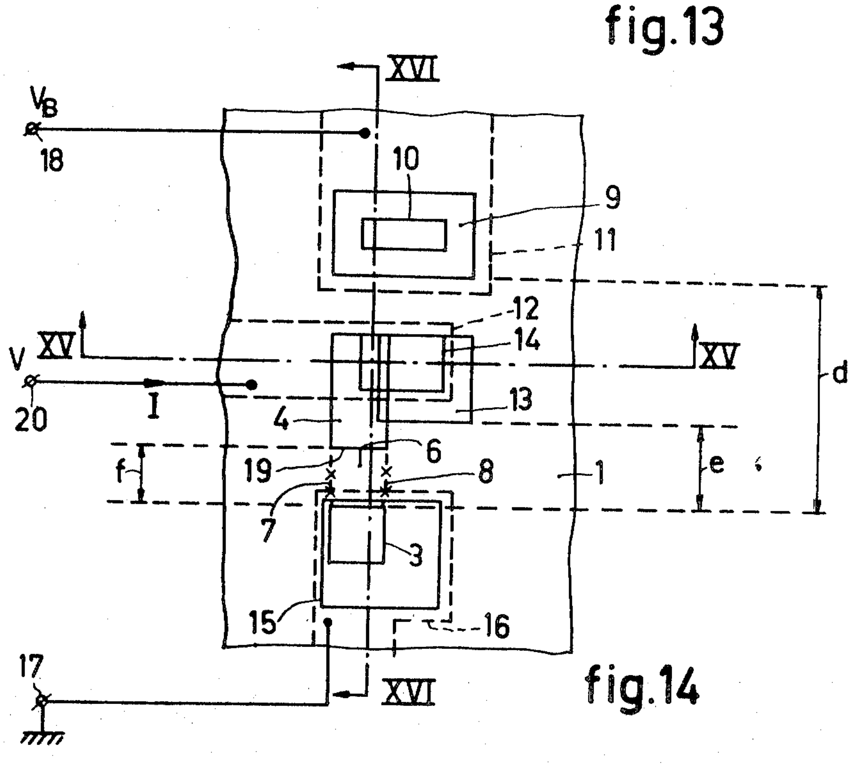

FIG. 14 is a diagrammatic plan view of still another semiconductor device according to the invention.

Figure 15:
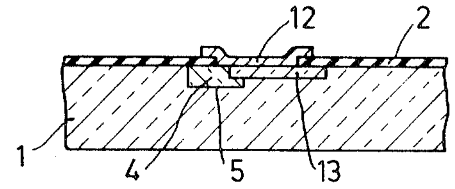
Figure 16:
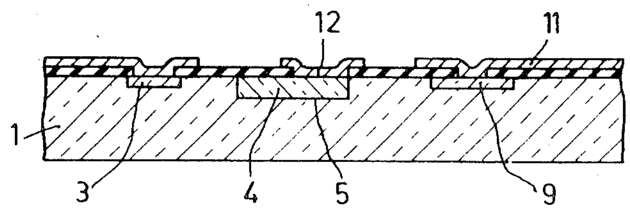
Figure 17:
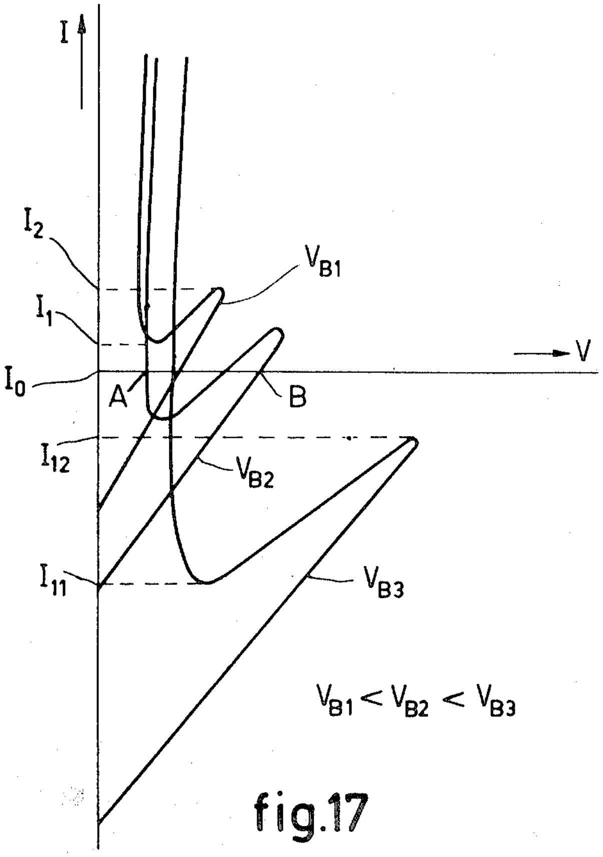

FIGS. 15 and 16 are diagrammatic cross-sectional views of the device shown in FIG. 14 taken on the lines XV—XV and XVI—XVI, respectively, and FIG. 17 shows the input characteristic of the device shown in FIG. 14 for 3 different values of the supply voltage.

Figure 2:
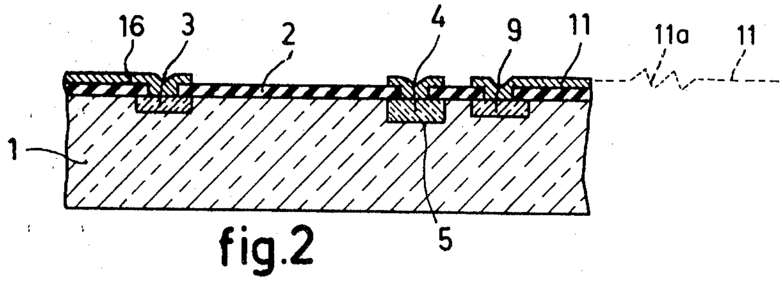
FIGS. 2 and 3 are diagrammatic cross-sectional views of the semiconductor device shown in FIG. 1 taken on the line II—II and III—III, respectively, in FIG. 1.
Figure 3:
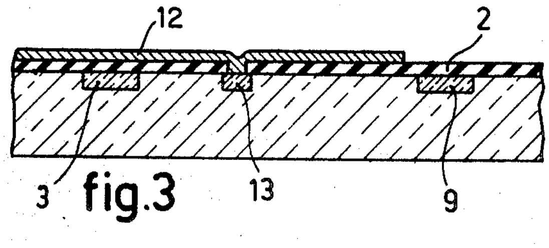

FIG. 1 is a diagrammatic plan view and FIGS. 2 and 3 are diagrammatic cross-sectional views of a semiconductor device according to the invention employing a semiconductor body having a bistable circuit element.

The bistable circuit element comprises a region 1 of *n*-type silicon having a resistivity of 0.3 ohm cm. which is covered with an electrically insulating layer 2 of silicon oxide, 0.6 micron thickness. On this region 1 are provided a first connection contact in the form of a strip-shaped diffused N-type surface region 3, and an emitter electrode which is constituted by a diffused surface region 4 of P-type silicon which constitutes a PN-junction 5 with the region 1. An injection stream of minority charge carriers, in this case holes, from the emitter electrode 4 to the first connection contact 3 through the region 1 can be produced by the emitter electrode 4 so that conductivity modulation can occur in a modulation region 6 extending from the emitter electrode to the contact 3. The limits of said modulation region 6 are denoted in FIG. 1 to an approximation and diagrammatically by the dash-and-cross lines 7 and 8.

Furthermore, a second connection contact in the form of a striplike diffused N-type surface region 9 substantially parallel to the first connection contact 3 is provided on the region 1 and is connected to a connection conductor 11 through a window 10 provided in the oxide layer 2, which conductor has the form of a metal layer provided partly on the oxide layer 2. The emitter electrode 4 is situated between the connection contacts 3 and 9 and adjoins, through a contact window in the oxide layer 2, a metal layer 12 which is conductively connected to an auxiliary contact in the form of a diffused N-type surface region 13 provided on the region 1 outside the modulation region 6, which surface region is connected to the metal layer 12 through a contact window 14 in the oxide layer 2. The connection contact 3 is connected to a metal layer 16 through the contact window 15.

In the operating condition the metal layer 16 is applied or connected to a reference potential, for example earth, through the connection terminal 17 (see FIG. 1), while the metal layer 11 is applied or connected through the connection terminal 18, to a potential $V_B$ which is positive with respect to the terminal 17. A stream of electrons is produced through the region 1 from the contact 3 to the contact 9, the resistance in the device described here between the connection conductor 11 and the part of the region 1 situated below the emitter electrode 4 being formed substantially entirely by the part of the current path extending in the region 1.

In circumstances, however, this resistance may alternatively be constituted by a series resistance extending beyond the region 1 which is situated either at least partly on the insulation layer 2, which is illustrated in phantom at 11*a* in FIG. 2, or, for example, is integrated in the region 1 as a diffused resistor.

The auxiliary contact 13 is situated with respect to the emitter electrode 4 and the first connection contact 3 in such manner that in the operating condition in the absence of conductivity modulation between the emitter electrode 4 and the contact 3, the potential difference in the absolute sense between the contacts 13 and 3 is smaller than the potential difference between the contact 3 and the region 1 at the area of the edge 19 of the emitter electrode which is situated nearest to the contact 3.

The device described may be in two stable conditions, in one condition of which, the ignited condition, holes are injected by the emitter electrode in the region 1 and produce conductivity modulation in the region 6, whereas in the other stable condition, the extinguished condition, no conductivity modulation takes place. In the ignited condition the emitter electrode 4 is polarized in the forward direction and in the extinguished condition it is polarized in the reverse direction. When the electrode 4 injects (which injection may be started in various manners, for example, by a voltage pulse in the forward direction across the PN-junction 5) the holes are driven from the emitter electrode 4 to the contact 3 by the drift field in the region 1 occurring as a result of the supply voltage $V_B$. As a result of this, conductivity modulation occurs in the region 6 when the injection is sufficiently strong so that at least at the area of the emitter edge 19, the region 1 obtains a potential with respect to the contact 3 which is lower than the potential at the area of the contact 13. This has for its result that the emitter 4 at that area remains in the forward direction so that the injection is maintained also in the absence of an applied external voltage across the junction 5 in which in the conductor 12 a current flows from the contact 13 to the emitter 4 which is injected in the region 1 as a hole current.

When the emitter electrode 4 does not inject, the potential of the contact 13 and hence also of the emitter region 4 is always lower than the potential of the region 1 at the area of the emitter as a result of the location of the contact 13 with respect to the emitter electrode 4, so that the device remains in the extinguished condition independent of the value of $V_B$.

Figure 4:
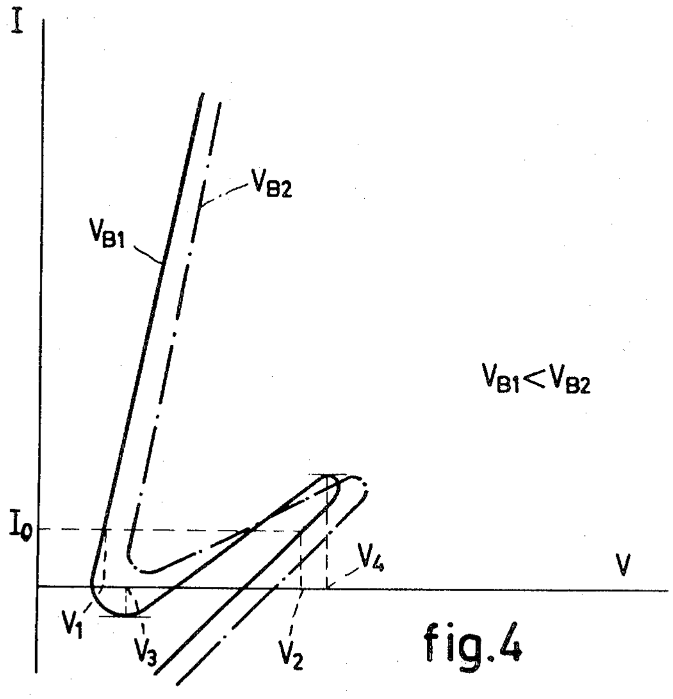
FIG. 4 shows the input characteristic of the semiconductor device shown in FIG. 1 for two different values of the supply voltage.

The metal layer 12 in FIG. 1 connected to a connection terminal 20 and the metal layer 16 connected in FIG. 1 to a connection terminal 17 are the input conductors of the device. FIG. 4 diagrammatically shows the input characteristic of the device for two values $V_{B1}$ and $V_{B2}$ of the supply voltage, where $V_{B2}>V_{B1}$. In this example $V_{B2}=3$ Volt and $V_{B1}=1$ Volt. The input current 1 is plotted as a function of the input voltage V (see also FIG. 1). It appears from FIG. 4 that with the same input current, for example $1_o$, two stable input voltages $V_1$ and $V_2$ differing from zero may occur in that the input characteristic shows a minimum and a maximum, the input voltage $V_3$ associated with the minimum being lower than the input voltage $V_4$ which is associated with the maximum. The input characteristic consists of three branches which show a positive differential resistance. The outermost branches represent stable conditions of the device whereas the central branch represents unstable conditions.

With a supply voltage $V_{B1}$, in which the I–V characteristic intersects the V axis at three points, the value zero may be chosen for $I_o$ (see FIG. 4) at which hence two nonconductive stable conditions may occur and the advantage of minimum dissipation is achieved.

FIGS. *5a* to *5d* show how the bistable element described here can be controlled by the input current at constant supply voltage. FIGS. *5b* and *d* show the input characteristic for a given value of the supply voltage. At an input current $I_o$ which may or may not be equal to zero, the stable conditions A (ignited) or B (extinguished) occur.

When a temporary variation is produced in the input current (see FIGS. *5a* and *b*) a desired stable condition can be adjusted if said variation is suitably chosen. FIG. *5a* shows how the input current in the form of a pulse is temporarily reduced to the value $I_u$ which (see FIG. *5b*) is situated outside the interval bounded by the minimum $I_1$ and the maximum $I_2$ of the input characteristic. If before the pulse the bistable element is in condition A, the element in I–V plane traverses the path denoted by arrows. After the input current has returned to the original value $I_o$, the element has come into the stable condition B. If initially the element is in condition B, the element remains in condition B also after the pulse, as will be obvious from the Figure.

It is shown in FIGS. *5c* and *d* how the element is controlled with a positive input current pulse. In this case also, the extreme value $I_u$ (see FIG. *5d*) lies outside the interval bounded by $I_1$ and $I_2$. If the element is initially in condition B, the path denoted by arrows is followed so that after completion of the pulse the condition A is adjusted. If the initial condition is A, it is not varied by the pulse. So the bistable element can be ignited by a positive input current pulse and extinguished by a negative pulse subject to the extreme current value lying outside the said interval since otherwise no junction between the stable branches of the characteristic takes place.

The principal dimensions of the device described are shown in FIG. 1 where the distance *a* is 125 microns, the distance *b* 25 microns, the distance *c* 100 microns and the distance *d* 175 microns. The boron-doped region 4 has a thickness of 2.5 microns and a surface concentration of approximately $10^{19}$ atoms/ccm. The phosphorous-doped regions 3, 9 and 13 have a thickness of approximately 1.5 microns and a surface concentration of approximately $10^{21}$ atoms/cc. The device can entirely be manufactured by means of standard methods commonly used in semiconductor technology while using two diffusions for forming the N-type surface regions 3, 9, 13 and the P-type region 4.

Two examples of using the bistable circuit element described will now be given.

The first example (see FIG. 6) diagrammatically shows the use of said circuit element as a component of a shift register. Corresponding components in FIGS. 1 to 3 and in FIG. 6 are referred to by the same reference numerals. In the diagrammatic plan view of FIG. 6 is shown a part of a shift register having two bistable elements A and B as described above which are separated from each other in the Figure by dot-and-dash lines, while the relative reference numerals are provided with an A or B according to the element with which they are associated. The elements A and B are provided on the same region 1 of N-type silicon. The first connection contact 3 and the second connection contact 9 are common for all the elements of the shift register. The elements A and B are coupled together by a collector coupling contact 31A and an emitter coupling contact 32B which are electrically connected together by a conductor 33 in the form of a metal layer. The emitter electrodes 4A and 4B and the coupling contacts 31A and 32B are constituted by P-type conductive diffused surface regions. The auxiliary contacts 13A and 13B are constituted, like in the preceding example, by N-type diffused regions which are connected to the emitter electrodes 4A and 4B by metal layers 12A and 12B which are insulated from the region 1. The collector coupling contact 31A is provided on the modulation region 6A of the element A. The emitter coupling contact 32B is situated so near to the auxiliary contact 13B of the element B, that the emitter coupling contact 32B can produce conductivity modulation over substantially the whole distance between said contacts 9 and 13B by the injection of holes between the auxiliary contact 13B and the connection contact 9.

The operation of this shift register will be explained with reference to the following four cases. Like in the preceding example, the conductor 3 is set up at a reference potential, for example, earth, while the conductor 9 is set up at a positive supply voltage $V_B$ which, however, may temporarily change sign. See FIG. 7, in which the variation of the supply voltage $V_B$ with time *t* is shown during operation of the shift register, it being assumed for simplicity that the emitter coupling diode 32A does not come in the forward direction.

First Case

In the initial condition, both the element A and the element B are extinguished. During the shift pulse (between the times $t_1$ and $t_2$, see FIG. 7) no or only a negligible injection occurs from the contact 4B to conductor 9, and after completion of the pulse, at the instant $t_2$, the element B returns to the (extinguished) final condition. After the shift pulse the condition of the elements A and B hence has not varied.

Second Case

In the initial condition the element A is ignited and the element B is extinguished. During the shift pulse the holes injected in the modulation region 6A of element A are sucked off by the collector coupling contact 31A and injected by the emitter coupling contact 32B in the direction of the conductor 9 as a result of the drift field occurring during the shift pulse. As a result of this, conductivity modulation occurs substantially throughout the region between the auxiliary contact 13B and the conductor 9, so that after the end of the shift pulse the potential of contact 13B has increased to such an extent that the emitter electrode 4B is polarized in the forward direction so that the element B is ignited. After the shift pulse, element A is extinguished since by removal of holes from the modulation region 6A the resistance modulation there is removed and hence the emitter electrode 4A comes in the reverse direction as a result of its location with respect to the auxiliary contact 13A. Therefore, after the shift pulse the element A is extinguished and element B is ignited.

Third Case

In the initial condition the element A is extinguished and the element B is ignited. The holes injected in the modulation region 6B of element B are sucked off during the shift pulse by the collector coupling contact 31B. After the shift pulse holes are not present in either of the two modulation regions 6A and 6B and therefore both the element A and the element B are extinguished.

Fourth Case

In the initial condition the element A and the element B are both ignited. The holes injected in the modulation region 6B of element B are sucked off during the shift pulse by the collector coupling contact 31B. The holes injected in the modulation region 6A of element A are simultaneously sucked off by the collector coupling contact 31A and injected in the direction of the conductor 9 by the emitter coupling contact 32B. After the shift pulse the element B is therefore ignited in a manner analogous to that described in the second case while element A is extinguished as a result of the removal of the holes from the modulation region 6A.

When the ignited condition is denoted by 1 and the extinguished condition by 0, the above may be summarized in the following table:

| Initial condition | Final condition |
|---|---|

| A | B |
|---|---|
| 0 | 0 |
| 1 | 0 |
| 0 | 1 |
| 1 | 1 |

| A | B |
|---|---|
| 0 | 0 |
| 0 | 1 |
| 0 | 0 |
| 0 | 1 |

FIG. 8 is a plan view of a part of an operating shift register constructed according to the diagram shown in FIG. 6. In this Figure also corresponding components are denoted by the same reference numerals. The contact geometry in this construction is such that an optimum effect is obtained. For example, the emitter electrodes 4A and 4B are provided with punctiform parts 19A and 19B, respectively, on the side of the conductor 3 so that on the side where hole injection is to take place a high-current density and hence a good injection efficiency is obtained. Furthermore, at the area of the contacts 13B and 32B the conductor 9 is constructed so that it surrounds said two contacts for a considerable part. As a result of this the region to be modulated between the contacts 13B and 9 is reduced while at the same time the holes injected by the contact 32*b* are lost to a far lesser extent by lateral diffusion for conductivity modulation due to the more favorable field distribution. The form of the contacts 31A and 31B is based on analogous reasons.

FIG. 9 is a diagrammatic plan view and FIG. 10 and 11 are diagrammatic cross-sectional views taken respectively on the line X—X and XI—XI of a device having a bistable element as described above in the form of a memory element. Corresponding components in FIGS. 9 and 1 are again referred to by the same reference numerals, while in FIG. 9 conductive connections are denoted diagrammatically by lines.

As already stated in the description with reference to FIGS. 1 to 4, the bistable element consisting of the emitter electrode 4 and the contacts 13, 3 and 9 in the operating condition may be in the extinguished or ignited condition. In the device shown in FIG. 9 a readin contact 41 is provided between the emitter electrode 4 and the second connection contact 9 and is in the form of a P-type conductive surface region which can inject holes in the N-type conductive region 1 so that conductivity modulation may occur between the contacts 41 and 3, and hence also between the emitter electrode 4 and the first connection contact 3. As a result of this, binary information can be stored in the memory element. This is effected in the following manner, see also FIG. 12. The conductor 3 is connected to earth as in the preceding examples. A supply voltage $V_B$ which is positive with respect to the conductor 3 is applied to the conductor 3. A bias voltage U may be applied, for example, through a connection terminal 42 (see FIG. 9) to the readin contact 41 with respect to the conductor 3. The binary information is stored in the memory element by a temporary reduction (write pulse) of the supply voltage $V_B$. See FIG. 12 in which the variation of $V_B$ is plotted against time and in which the write pulse occurs between the times $t_o$ and $t_1$.

When the bistable element is in the extinguished condition, that is to say in the condition with the highest input voltage, the temporary reduction of $V_B$ will have no influence on the condition of the element in the absence of the bias voltage U. However, when the element is in the ignited condition, that is to say the condition having the lowest input voltage, the reduction of $V_B$ will result in a reduction of the current from the contact 13 to the emitter electrode 4. As a result of this the injection decreases and hence the conductivity modulation in the modulation region 6. Due to the resulting increase in resistance in the region 6, the current from 13 to 4 is reduced even further. This is continued until the voltage difference between the emitter electrode 4 and the underlying part of the region 1 is so small that no significant injection takes place any longer. After restoring the original supply voltage $V_B$ the bistable element is hence extinguished.

If, however, the bias voltage U is chosen to be so that the readin contact 41 is polarized in the forward direction during the write pulse and injects sufficiently (see FIG. 12) the bistable element will be in the ignited condition after restoring the original supply voltage due to the conductivity modulation in the region 6, independent of its condition at the beginning of the reduction $V_B$.

Therefore, in accordance with the above, binary information which is introduced by means of the bias voltage U can be stored in the memory element by means of a write pulse on the supply voltage.

Reading out of the stored information, that is to say determining the condition in which the bistable element is, may be effected in various manners. For example, a readout pulse can be superimposed upon the supply voltage $V_B$, reading out being effected between the emitter electrode 4 and the conductor 3 through a coupling capacitor. When the element is in the ignited condition, the readout pulse will be smaller than in the extinguished condition as a result of the reduced resistance of the modulation region 6. In this case, amplification of the readout pulse will generally have to take place in order to obtain a useful signal. The memory element of FIGS. 9 to 11 can be read in a particularly simple manner. For that purpose (see FIG. 9) a readout contact 45 in the form of a diffused N-type surface region is provided on the modulation region 6. This readout contact 45 is connected to the base 46 of a lateral planar NPN transistor which is provided in the conventional manner by using photolithographic etching methods by selective diffusion in the N-type region 1 and comprises a P-type base region 46, an N-type emitter region 47 and an N-type collector region 48 (see also FIG. 10). The first connection contact, the conductor 3, is connected, through a metal layer 44 provided on the oxide layer 2, to the emitter region 47. Between the collector region 48 and the emitter region 47 (see FIG. 9) a bias voltage is applied so that the collector 48 is polarized in the reverse direction. Reading out occurs by a temporary increase of the supply voltage $V_B$ in the form of a readout pulse. The supply voltage and the increase thereof are now chosen to be so that when the bistable element is ignited the supply voltage has at all times, so also during the readout pulse, such a value that the potential of the readout contact, so of the base region 46, is so small that the emitter 47 does substantially not inject so that no pulse is read out between the collector 48 and the conductor 3. When, however, the bistable element is extinguished, the potential of contact 45 becomes so high during the readout pulse on $V_B$ as a result of the higher resistance of the modulation region 6 that the emitter 47 starts injecting so that an amplified pulse is read out between the collector 48 and the conductor 3, through the coupling capacitor C.

Memory elements as described above can be constructed to form a memory in which the elements are arranged in a matrix. See FIG. 13 in which such a matrix is diagrammatically shown and in which corresponding components in FIGS. 9 and 13 are referred to by the same reference numerals. The readin contacts 41 are connected to conductors 51 ("bitlines") for introducing information and the collectors 48 to "readout lines" 52, while the readin and readout pulses are supplied through "word lines" 53 which intersects the bit 51 and readout 52 lines, said intersections being easily realizable by constructing the conductors 53 and the earthed conductors 54, at least at the area of the intersections, in the form of diffused strips.

FIG. 14 is a plan view and FIGS. 15 and 16 are cross-sectional views of another semiconductor device employing a bistable element according to the invention. Corresponding components in FIGS. 14 to 16 and 1 to 3 are referred to by the same reference numerals. The first connection contact 3 and the second connection contact 9 in this embodiment are not in the form of strips but in the form of localized regions. The window 15 and the metal layer 16 extend for a considerable part outside the diffused region 3, a metal semiconductor contact being formed between the layer 16 and the region 1 and giving a high recombination rate so that the holes originating from the emitter electrode 4 are smoothly conveyed to the contact 3 and cannot adversely influence the operation of the device, for example, by partial back diffusion. In contrast with the embodiments described above, the auxiliary contact 13 in this preferred embodiment (see FIG. 14) is situated with respect to the emitter electrode 4 and the first connection contact 3 so that in the operating condition, in the absence of conductivity modulation, the potential difference in the absolute sense between the auxiliary contact 13 and the first connection contact 3 is larger than the difference between the potential of the first connection contact 3 and the potential of the region 1 at the area of the edge 19 of the emitter electrode which is situated nearest to the contact 3.

In the embodiment shown, the emitter electrode 4 is partly overlapped by the auxiliary contact 13, see FIGS. 14 and 15. The principal dimensions of the device are shown in FIG. 14, in which the distance $d$ = 40 microns, the distance $e$ is 15 microns and the distance $f$ is 10 microns.

This device is distinguished electrically from the devices described so far in various manners, as will be demonstrated with reference to FIG. 17 in which the input current I is plotted as a function of the input voltage V (see also FIG. 14) for three different values of the supply voltage $V_B$, in which $V_{B1}$ = 2 Volt, $V_{B2}$ = 3 Volt and $V_{B3}$ = 6 Volt.

As in the embodiments already described (see FIG. 4), the input characteristic shows a minimum and a maximum as well as three branches having positive differential resistance, so that for certain values of the input current I two stable conditions are possible in one of which (the ignited condition) conductivity modulation occurs in the region 6 (see FIG. 14). However, in contrast with the devices shown in FIGS. 1 to 13, the emitter electrode 4 in this device is polarized in the forward direction both in the extinguished and in the ignited condition as a result of the location of the auxiliary contact 13. Only in the ignited condition is the potential distribution in the device so that conductivity modulation can occur.

A further very important difference between this device and the above-described devices is that the bistable element in this case can be controlled in two different manners.

In the first place it will be obvious from the characteristic shown in FIG. 17 that this element can also be controlled with the input current when the supply voltage $V_B$ is constant, in a manner entirely analogous to that described above with reference to FIGS. 5*a* to *d*. For this way of controlling only the form of the input characteristic is of importance.

In contrast with the above-described embodiments, the element described here may also be controlled with the supply voltage $V_B$ when the input current $I_o$ is constant. As a matter of fact it appears from FIG. 17 that the minimum and the maximum of the input characteristic move downwards for increasing values of $V_B$ hence to lower values of I, in contrast with FIG. 4. With a supply voltage $V_{B2}$ the stable voltage condition A or B occurs with an input current $I_o$ (see FIG. 17) in which in this example $I_o$ is chosen to be 0. When the supply voltage $V_{B2}$ is temporarily reduced to the value $V_{B1}$, in which the minimum value $I_1$ and the maximum value $I_2$ of the I–V characteristic are both larger than the constant input current $I_o$, the bistable element, after restoring the original supply voltage, is in the condition B independent of its initial position since with a supply voltage $V_{B1}$ (see FIG. 17) only the branch which denotes the extinguished condition B intersects the line $I = I_o$. If on the contrary the supply voltage $V_{B2}$ is temporarily increased to $V_{B3}$, in which the minimum $I_{11}$ and the maximum $I_{12}$ of the input characteristic are both smaller than $I_o$, only the branch of the (ignited) A conditions intersects the line $I = I_o$ during said increase so that after the return to the supply voltage $V_{B2}$ the bistable element is in the condition A, the ignited condition.

It will be obvious that the invention is not restricted to the examples described but that many variations are possible to those skilled in the art without departing from the scope of this invention. For example, by starting from a P-type semiconductor body instead of from an N-type body, devices can be obtained which are complementary to the devices described and in which the conductivity type of each region is displaced by the opposite type. The potentials applied should be varied in agreement with the instructions given in the description. Furthermore, in all the examples striplike connection contacts can be replaced by separate connection contacts for each element which are interconnected in the correct manner, or conversely. It will furthermore be obvious that transition forms between a device according to the last-mentioned example and the preceding examples can be manufactured by providing the auxiliary contact at an intermediate location. The silicon oxide layer may also be replaced by another insulating material, for example, silicon nitride, and in general all the mentioned technical and technological means may be replaced by equivalent means.

What is claimed is:

1. A semiconductor device having a semiconductor body comprising a bistable semiconductor circuit element, characterized in that the circuit element comprises a region of one conductivity type, on which said region a first connection contact is provided and an emitter electrode for producing an injection stream of minority charge carriers through the said region from the emitter electrode to the first connection contact so that conductivity modulation can occur in a modulation region extending from the emitter electrode to the first connection contact, a second connection contact being provided on the said region and being connected to a connection conductor to produce between the first and the second connection contacts a stream of majority charge carriers in the opposite direction as the said injection current through the said region, the emitter electrode being situated between the first and the second connection contacts and being conductively connected to a further auxiliary connection contact provided on the said region outside the modulation region, all this in such manner that two stable input voltages differing from zero can occur with the same input current between an input conductor connected to the emitter electrode and an input conductor connected to the first connection contact in that the input current shows a minimum and a maximum dependent upon the input voltage, the input voltage associated with the minimum being lower than that associated with the maximum.

2. A semiconductor device as claimed in claim 1, characterized in that its second connection contact is connected to the connection conductor through a series resistor.

3. A semiconductor device as claimed in claim 1, characterized in that the emitter electrode is constituted by a surface region of the opposite conductivity type which forms a PN junction with the region of one conductivity type.

4. A semiconductor device as claimed in claim 1 characterized in that the said connection contacts and the emitter electrode are provided on the same surface of the semiconductor body.

5. A semiconductor device as claimed in claim 4, characterized in that the surface of the body is coated at least partly with an electrically insulating layer, the connection conductors and input conductors being situated at least partly on the insulating layer and adjoining the semiconductor body through apertures in the insulating layer.

6. A semiconductor device as claimed in claim 1 characterized in that the first and second connection contacts are constituted by two substantially parallel conductors.

7. A semiconductor device as claimed in claim 6, characterized in that the parallel conductors comprise striplike diffused surface regions.

8. A semiconductor device as claimed in claim 6 characterized in that the device constitutes a memory in which for introducing binary information a readin contact is provided between the emitter electrode and the second connection contact, said readin contact being adapted to inject minority charge carriers so that conductivity modulation can occur between the emitter electrode and the first connection contact.

9. A semiconductor device as claimed in claim 8, characterized in that a readout contact is provided on the modulation region, whereby a readout voltage can be derived between said readout contact and the first connection contact.

10. A semiconductor device as claimed in claim 9, characterized in that the readout contact is connected to the base and the first connection contact is connected to the emitter of a transistor, the stored binary information being readout between the collector and the base of said transistor.

11. A semiconductor device as claimed in claim 10, characterized in that the base region of the transistor is constituted by a surface region of the opposite conductivity type provided in the said region of one conductivity type, in which the emitter region and the collector region of the transistor are provided.

12. A circuit arrangement as claimed in claim 10, characterized in that means are present for setting up a supply voltage between the first and second connection contacts and for producing a temporary increase of the supply voltage and that the collector of the transistor is polarized in the reverse direction by a bias voltage between the collector and the emitter, the supply voltage and the increase thereof being chosen to be so that when the bistable element is in the condition with the lowest input voltage the emitter current of the transistor during the increase of the supply voltage remains substantially equal to zero and that, when the bistable element is in the condition with the highest input voltage, an emitter current occurs only during the increase of the supply voltage in the transistor, which current can be detected at the collector.

13. A circuit arrangement comprising a device as claimed in claim 8, characterized in that means are present for setting up a supply voltage between the first and second connection contacts and for producing a temporary reduction of the supply voltage and for setting up a bias voltage between the readin contact and the first connection contact, the supply voltage, the reduction of the supply voltage and the said bias voltage being mutually chosen to be so that in the absence of said bias voltage the bistable element, after restoring of the original supply voltage, is in the condition with the highest input voltage, while in the presence of the said bias voltage, during the reduction of the supply voltage, minority charge carriers are injected through the readin contact so that the bistable element, after restoring of the original supply voltage, is in the condition with the lowest input voltage.

14. A semiconductor device as claimed in claim 1 characterized in that the auxiliary contact is situated with respect to the emitter electrode and the first connection contact in such manner that in the operating condition, in the absence of conductivity modulation, the potential difference in the absolute sense between the auxiliary contact and the first connection contact is smaller than the difference between the potential of the first connection contact and the potential of the said region of one conductivity type at the area of the point of the emitter electrode which is situated nearest to the first connection contact.

15. A semiconductor device as claimed in claim 14, characterized in that the device constitutes a shift register having at least two bistable elements which are arranged on the same said region of one conductivity type, the first connection contacts and also the second connection contacts of the two bistable elements being electrically connected together and the bistable elements being coupled by a collector coupling contact and an emitter coupling contact which are electrically connected together, the collector coupling contact being provided on the modulation region of the first bistable element and being adapted to collect minority charge carriers therefrom, the emitter coupling contact being situated so near to the auxiliary contact of the second bistable element that the emitter coupling contact can produce conductivity modulation substantially throughout the distance between said contacts by injection of minority charge carriers between said auxiliary contact and the said connection contact.

16. A semiconductor device as claimed in claim 15, characterized in that at least one coupling contact is formed by a diffused surface region of the opposite conductivity type.

17. A semiconductor device as claimed in claim 1, characterized in that with respect to the emitter electrode and the first connection contact the auxiliary contact is situated so that in the operating condition and in the absence of conductivity modulation the potential difference in the absolute sense between the auxiliary contact and the first connection contact exceeds the difference between the potential of the first connection contact and the potential of the said region of one conductivity type at the area of the point of the emitter electrode which is situated nearest to the first connection contact.

18. A semiconductor device as claimed in claim 17, characterized in that the auxiliary contact overlaps the emitter electrode at least partly.

19. A circuit arrangement comprising a device as claimed in claim 1, characterized in that means are present for setting up a supply voltage between the first connection contact and the connection conductor of the second connection contact, so that in the said region of one conductivity type a stream of majority charge carriers which is opposite to the injection stream is produced at least across the modulation region.

20. A circuit arrangement as claimed in claim 19, characterized in that the supply voltage has a value such that the said stable input voltages occur at an input current which is substantially equal to zero.

21. A circuit arrangement as claimed in claim 19, characterized in that in one stable condition the emitter electrode is polarized in the forward direction and in the other stable condition it is polarized in the reverse direction.

22. A circuit arrangement as claimed in claim 17, characterized in that the emitter electrode is polarized in the forward direction in both stable conditions.

23. A circuit arrangement as claimed in claim 17, characterized in that means are present for producing a temporary variation in the input current to adjust the stable voltage condition of the device.

24. A circuit arrangement as claimed in claim 17, characterized in that means are present for producing a temporary variation in the supply voltage to adjust the stable voltage condition of the device.

25. A circuit arrangement as claimed in claim 24, characterized in that means are present for temporarily varying the sign of the supply voltage to adjust the stable voltage condition of the bistable elements.

26. A circuit arrangement as claimed in claim 24, characterized in that the extreme value of the supply voltage occurring during the variation is at least so large that the minimum and maximum of the input current are both larger or are both smaller than the value of the input current at which the two said stable input voltages occur.

27. A circuit arrangement as claimed in claim 23, characterized in that the extreme value of the input current occurring during the variation is situated outside the interval which is bounded by the said minimum and maximum of the input current characteristic.

* * * * *